(12) United States Patent
Hupp

(10) Patent No.: US 7,668,321 B2
(45) Date of Patent: Feb. 23, 2010

(54) AUTOMATIC POWER FOLDBACK FOR AUDIO APPLICATIONS

(75) Inventor: Greg A. Hupp, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 797 days.

(21) Appl. No.: 10/672,534

(22) Filed: Sep. 26, 2003

(65) Prior Publication Data

US 2004/0258257 A1 Dec. 23, 2004

Related U.S. Application Data

(60) Provisional application No. 60/479,355, filed on Jun. 17, 2003.

(51) Int. Cl.
*H03F 21/00* (2006.01)

(52) U.S. Cl. .......................... 381/120; 700/94

(58) Field of Classification Search .......... 381/120, 381/102, 104, 28, 123; 700/94; 713/300, 713/340; 330/251, 254, 125 R
See application file for complete search history.

(56) References Cited

U.S. PATENT DOCUMENTS

| | | | | |
|---|---|---|---|---|
| 5,818,948 A * | 10/1998 | Gulick | ................. | 381/77 |
| 6,216,052 B1 * | 4/2001 | Gulick | ................. | 700/94 |
| 6,424,875 B1 * | 7/2002 | Yoon | ................. | 700/94 |
| 6,573,693 B2 * | 6/2003 | Okamoto | ................. | 323/273 |
| 6,970,571 B2 * | 11/2005 | Knorr et al. | ................. | 381/370 |
| 7,171,010 B2 * | 1/2007 | Martin et al. | ................. | 381/98 |
| 2001/0003166 A1 * | 6/2001 | Gulick | ................. | 700/94 |
| 2003/0059063 A1 * | 3/2003 | Inoue | ................. | 381/104 |

* cited by examiner

*Primary Examiner*—Vivian Chin
*Assistant Examiner*—Lun-See Lao
(74) *Attorney, Agent, or Firm*—John J. Patti; Wade J. Brady, III; Frederick J. Telecky, Jr.

(57) ABSTRACT

A power foldback circuit to automatically control the power of an audio amplifier by using the volume inputs to a pre-amp source which drives the audio amplifier. In an embodiment, a Universal Serial Bus (USB) on a personal computer is used to drive the audio speakers. In this circuit an audio digital to analog converter (DAC) with a USB interface receives a digitally encoded audio signal from a personal computer (PC). The USB DAC outputs an analog audio signal to a audio amplifier circuit. A supervisory circuit monitors the power used by the audio amplifier and through a volume control circuit lowers the volume control into the USB DAC to prevent the entire circuit from drawing more than the allowed power supplied by the USB connection to the PC.

13 Claims, 4 Drawing Sheets

AUTOMATIC POWER FOLDBACK FOR AUDIO APPLICATIONS

PRIORITY CLAIM

This application claims priority of U.S. Provisional Patent, Ser. No. 60/479,355, filed Jun. 17, 2003, entitled "Automatic Power Foldback (APF) for USB Audio Applications", the teaching of which are incorporated herein by reference.

TECHNICAL FIELD OF THE INVENTION

This invention relates to controlling power in an audio application, and more particularly to automatically controlling the power of an audio amplifier by using the volume inputs to a pre-amp source which drives the audio amplifier.

BACKGROUND OF THE INVENTION

In some audio applications it is sometimes necessary to limit the amount of power used by an audio amplifier due to power constraints. In a particular application, an audio amplifier that drives the speakers for a computer sound system has a limited amount of power available to the amplifier. In this system, an audio power amplifier is powered directly from a personal computer's USB (Universal Serial Bus) port. This is desirable to reduce the audio speakers wiring to a single connection to the speakers from the USB port. The USB interface connection includes power as well as a data bus. Power limitations of the USB port are defined by an accepted bus interface standard. The power is typically limited to ½ amp at 5 volts.

Overdriving the audio without limiting the current drawn on the USB port could damage the PC's USB drive circuits or cause them to current limit and shut down. Some prior art circuits would cut the current to the audio amplifier if the current draw rose to high. This would case an undesirable pause or stop in the audio output.

SUMMARY OF THE INVENTION

The present invention overcomes problems associated with the described prior art. In a preferred embodiment, the audio volume level of an DAC is controlled with a simple circuit to prevent an audio amplifier from drawing more than a specified amount of power.

Preferred embodiments of the present invention are directed to a USB speaker audio driver circuit. In this circuit a stereo audio digital to analog converter (DAC) with a USB interface receives a digitally encoded audio signal from a personal computer (PC). The USB DAC outputs an analog audio signal to a audio amplifier circuit. A supervisory circuit monitors the power used by the audio amplifier and through a volume control circuit lowers the volume control into the USB DAC to prevent the entire circuit from drawing more than the allowed power supplied by the USB connection to the PC.

Advantages of an embodiment of the present invention include a smooth reduction in volume without manual control when power limiting occurs. The circuit can adjust whenever needed to prevent power limiting without cutting out or losing contact with the data bus that was prevalent in prior art designs.

DETAILED DESCRIPTION OF THE INVENTION

Figure 1:
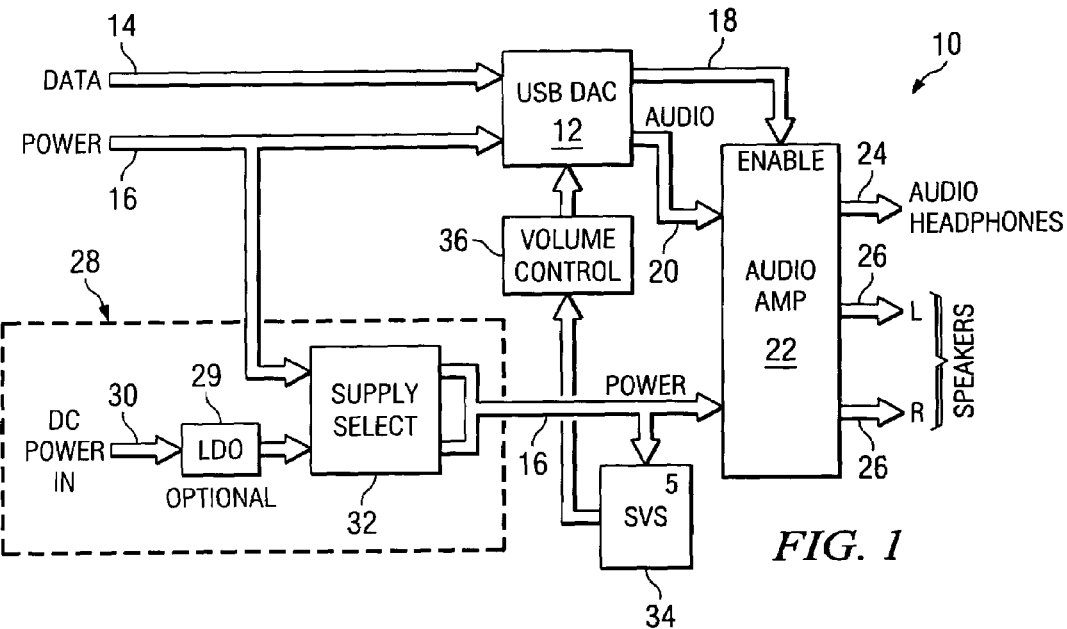
FIG. 1 illustrates a block diagram of an automatic power foldback circuit according to an embodiment of the present invention.

FIG. 1 illustrates a block diagram of an audio amplifier circuit 10 with automatic power foldback according to an embodiment of the present invention. A pre-amplifier circuit 12 (which may include a DAC) receives a data 14 and a power 16 signal. The pre-amplifier circuit outputs an enable signal 18 and a pre-amplified analog audio signal 20 to an amplifier 22. The amplifier 22 outputs audio signals 24, 26 for headphones and speakers (not shown).

Power for the circuits is provided by the power bus 16. Optionally, power can be supplied by a DC power input circuit 28. In this case, a load control circuit 29 is connected to the DC power input 30, and a supply selection 32 is made if there is power available from the DC input. (However, in the preferred embodiments described in more detail below, the advantage of the present invention is primarily achieved when the DC power input is not used and power is supplied by the USB power bus.) A supervisory power circuit 34 monitors the power used by the entire circuit, or that supplied to the audio amplifier. The supervisory power circuit 34 signals the volume control circuit 36 when power sags or exceeds the specified limit. The supervisor circuit may monitor the voltage level or current used.

The volume control circuit 36 inputs from the power supervisor circuit an indication of an over power limit state. The volume control circuit then outputs to the pre-amplifier circuit a signal that connects to the volume control of the pre-amplifer 12. The volume control circuit then adjusts the volume lower until indicated by the supervisory circuit 34.

Figure 2:
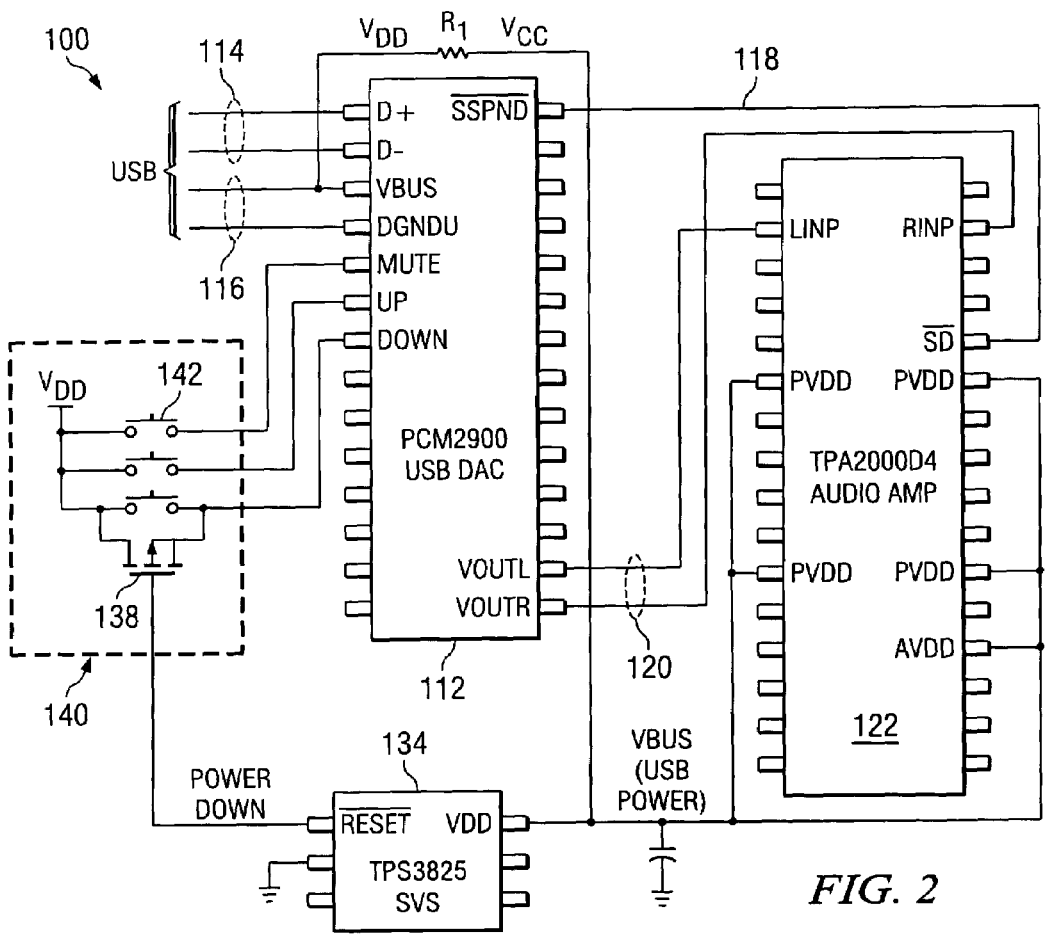
FIG. 2 illustrates a circuit diagram of an automatic power foldback circuit according to an embodiment of the present invention.

FIG. 2 illustrates a circuit diagram of an audio amplifier circuit 100 with automatic power foldback according to another embodiment of the present invention. This circuit provides a computer speaker drive system that allows the PC to drive audio speakers with just a USB connection from the PC to the speakers. Power for the speaker audio amplifier is also supplied by the USB port connection. The system includes a decoder to decode the digital audio signal to an analog audio pre-amplified signal, and an audio amplifier to drive the speakers. A USB DAC 112 includes a pre-amplifier circuit. The USB DAC 112 receives a data 114 and power 116 signal from a computer (not shown). The data signal 114 is a digital data stream containing an audio signal. The USB DAC has a USB interface to receive the digital data stream from the computer (not shown) and a decoder to convert the audio signal back to an analog signal. In the illustrated embodiment, the USB DAC is a Burr-Brown Product PCM 2900 from Texas Instruments Incorporated.

The USB DAC outputs an enable signal 118 and a pre-amplified analog audio signal 120 to an amplifier 122. The amplifier 122 outputs audio signals for headphones and speakers (not shown). In the illustrated embodiment, the audio amplifier is a TPA2000D4 from Texas Instruments Incorporated.

Power for the circuits is provided by the power bus 116. A supervisory power circuit 134 monitors the power used by the circuit including the audio amplifier. The supervisory power circuit 134 signals the volume control circuit 136 when power sags below a pre-determined limit or threshold or when the power exceeds the specified or pre-determined limit. In this embodiment, the supervisor circuit monitors the voltage level. In this embodiment, the supervisor power circuit is a TPS3825 part supplied by Texas Instruments Inc.

The volume control circuit 140 inputs from the power supervisor circuit an indication of an over power limit state. The volume control circuit then adjusts the volume lower until indicated by the supervisory circuit 134. When the voltage monitored by the supervisory circuit falls below 4.55 v, the reset(bar) output is asserted low. The reset(bar) output is connected to the gate of transistor 138. When activated, transistor 138 connects the volume control input—down 140 which lowers the audio signal output from the USB DAC. The volume control circuit also has switches 142 connected to each of the volume control inputs of the USB DAC to allow the user to manually adjust the volume of the speakers.

In an embodiment of the present invention, a resistor 144 is added between the USB power input and the Vcc source supplied to the audio amplifier and may also include the USB DAC chip. This resistor 144 is chosen to set the current trip point of the supervisory circuit 134. The resistor can be chosen to produce a trip point voltage (in this case 4.55 v) when the limit current is reached. This can be done to insure the entire circuit does not draw more than the USB standard dictates. On the other hand, the resistor can be left out of the circuit, and the current draw limited by the ability of the USB source. In this case the volume to the speakers could be potentially greater, but the circuit would depend on the USB source to protect against an overcurrent condition on the USB source.

Figure 3A:
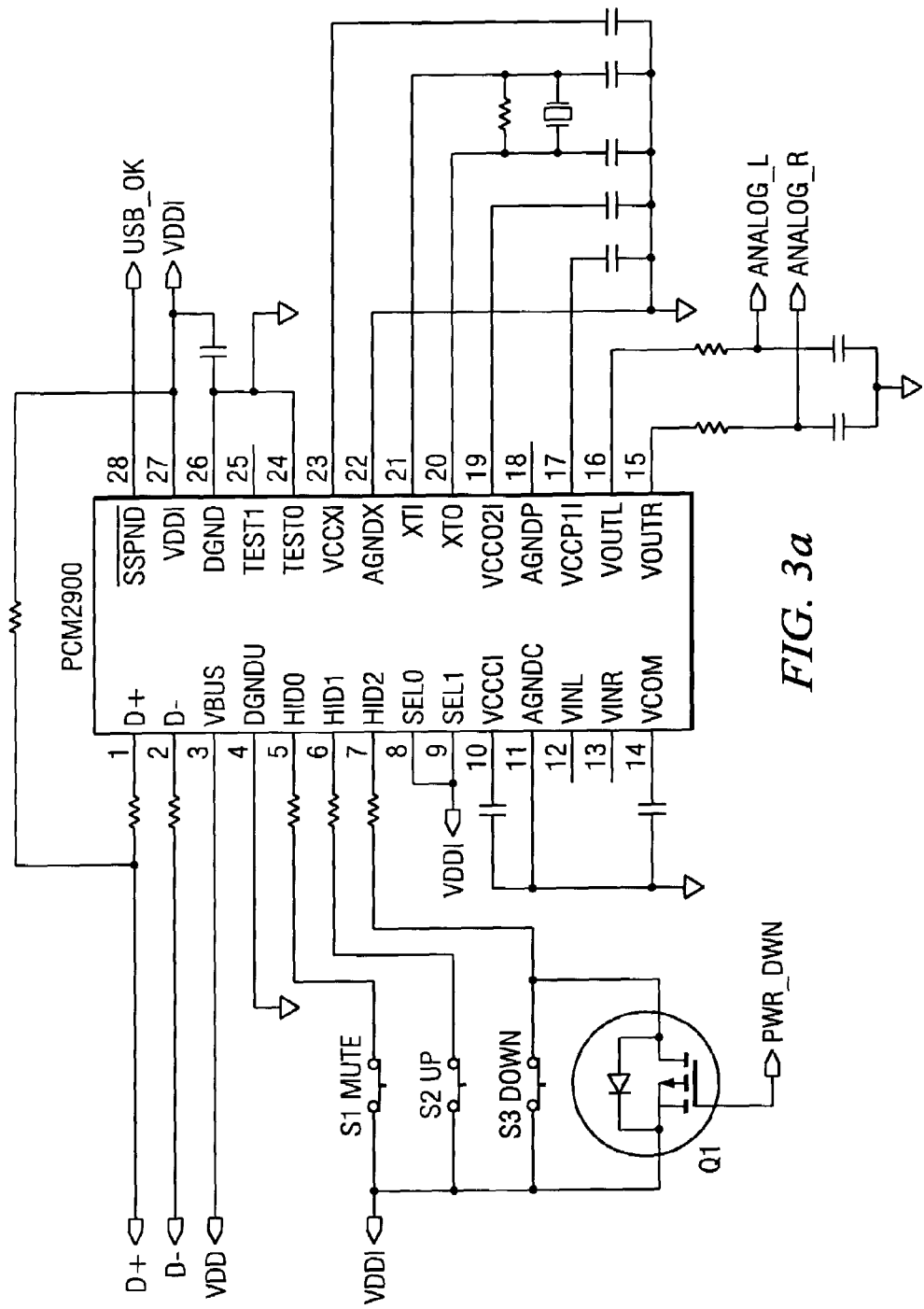
FIG. 3 illustrates a detailed circuit diagram of a USB speaker drive circuit which includes an automatic power foldback circuit according to an embodiment of the present invention.
Figure 3B:
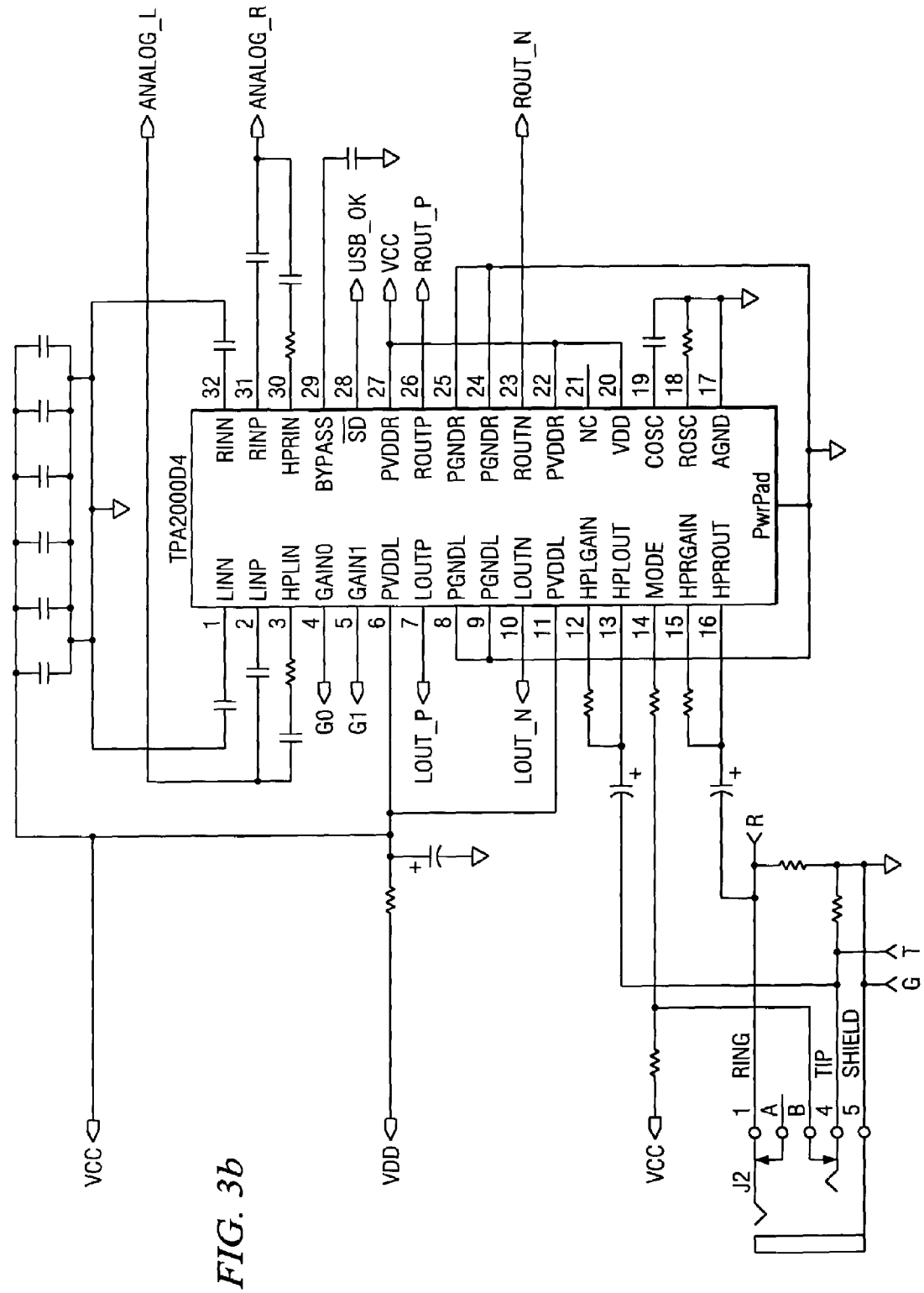
Figure 3C:
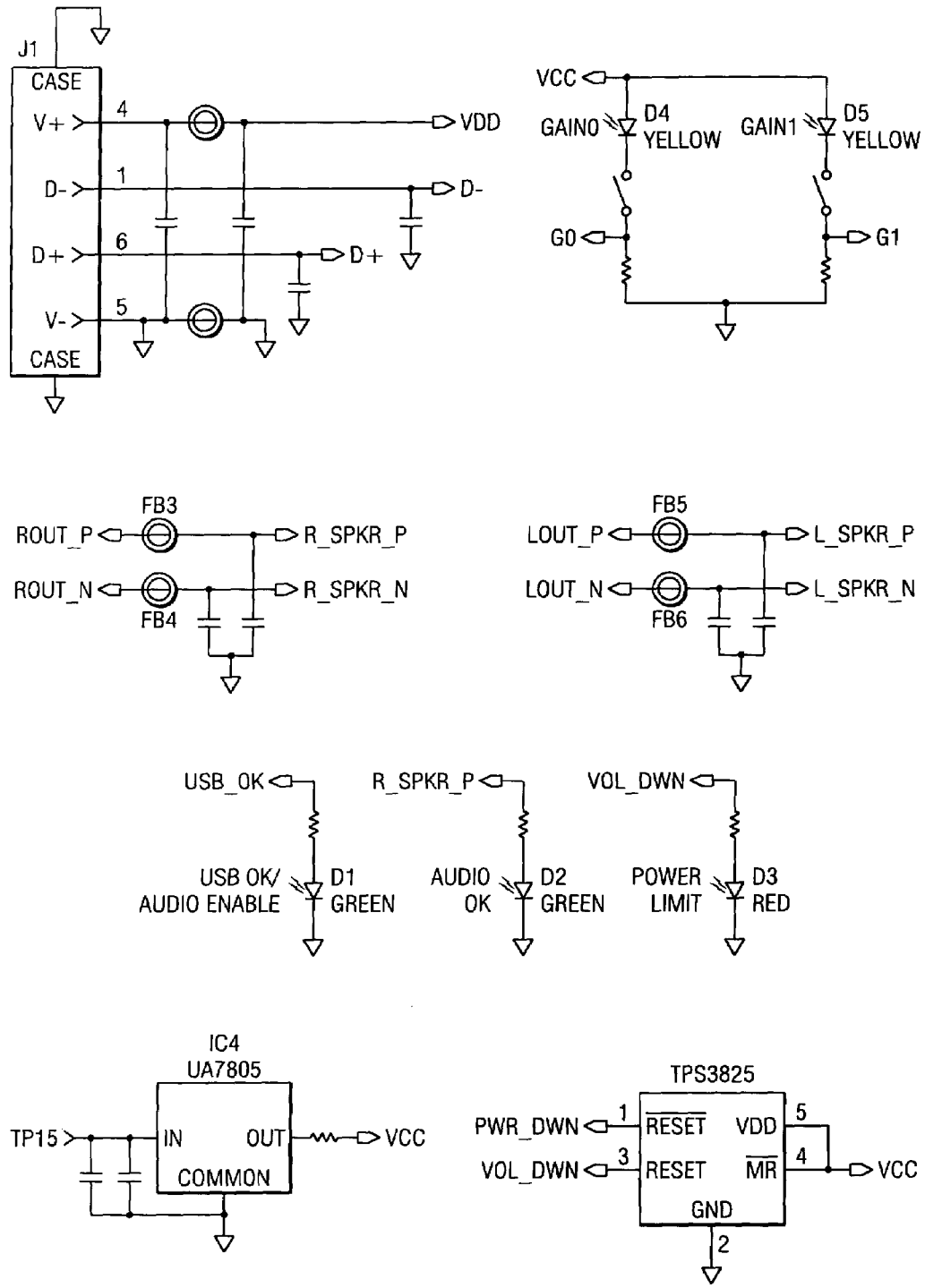

FIG. 3 illustrates a circuit diagram of an audio amplifier circuit 100 with automatic power foldback according to another embodiment of the present invention. This embodiment is essentially the embodiment described above with reference to FIG. 2 and includes the optional DC power input described in the discussion of FIG. 1. This schematic includes circuit features that are not essential to the invention claimed herein, but the schematic shows a complete implementation of the claimed circuit used in a computer speaker audio system which is driven from a USB.

OTHER EMBODIMENTS

Although the present invention has been described in detail, it should be understood that various changes, substitutions, and alterations could be made hereto without departing from the spirit and scope of the invention as defined by the appended claims.

What is claimed is:

1. A circuit for amplifying an audio source, the circuit comprising:
   an audio pre-amplifier having volume control inputs, wherein the pre-amplifier receives the audio source and receives power from a power source;
   an audio amplifier connected to the pre-amplifier and the power source, the audio amplifier outputting an amplified audio signal;
   a power supervisory circuit that monitors power used by the audio amplifier and pre-amplifier; and
   a volume control circuit that activates at least one of the volume control inputs when the supervisory circuit detects the power used the pre-amplifier and audio amplifier is beyond a pre-determined limit.

2. The circuit of claim 1 wherein the pre-amplifier is a Digital-to-Analog Converter (DAC).

3. The circuit of claim 1 wherein the volume control inputs are digital.

4. The circuit of claim 1 wherein the supervisory circuit detects whether a supply voltage to the amplifier falls below a pre-determined threshold.

5. An audio amplifier system for driving computer speakers from a bus port of a personal computer, the system comprising:
   a DAC having volume control inputs and a bus interface, wherein the DAC is adapted to receive a digital audio signal through the bus interface and output an analog audio signal;
   an audio amplifier that receives the analog audio signal from the DAC and outputs an amplified audio signal for driving speakers;
   a power supervisory circuit that monitors power used by the audio amplifier and the DAC; and
   a volume control circuit that activates at least one of the volume control inputs when the supervisory circuit detects the power used to drive the audio amplifier and DAC is beyond a pre-determined limit.

6. The system of claim 5 wherein the power used by the system is supplied over the bus port.

7. The system of claim 5 wherein the volume control inputs are adapted to be actuated by the user, and wherein the volume control circuit overrides a user actuation of the volume control inputs when the supervisory circuit detects the power signal used to drive the power supply input of the audio amplifier is beyond the pre-determined limit.

8. The system of claim 5 wherein the volume control inputs are digital.

9. The system of claim 5 wherein the supervisory circuit detects whether a supply voltage used to drive the audio amplifier falls below a pre-determined threshold.

10. An audio amplifier system for driving computer speakers through a Universal Serial Bus (USB) port comprising:
    a USB DAC having volume control inputs and a USB interface, wherein the USB DAC is adapted to receive a digital audio signal and output an analog audio signal, and wherein the USB DAC is adapted to receive power through the USB port;
    an audio amplifier that receives the analog audio signal from the USB DAC and that outputs an amplified audio signal for driving speakers, wherein the audio amplifier is adapted to receive power through the USB port;
    a power supervisory circuit that monitors power used by the audio amplifier and the USB DAC; and
    a volume control circuit that activates at least one of the volume control inputs when the supervisory circuit detects the power used to drive the audio amplifier and the USB DAC is beyond a pre-determined limit.

11. The system of claim 10 wherein the volume control inputs are adapted to be actuated by the user, and wherein the volume control circuit overrides a user actuation of the volume control inputs when the supervisory circuit detects the power signal provided by the power input of the bus port connection is beyond the pre-determined limit.

12. The system of claim 10 wherein the volume control inputs are digital.

13. The system of claim 10 wherein the supervisory circuit detects whether a supply voltage used to drive the audio amplifier falls below a pre-determined threshold.

* * * * *

UNITED STATES PATENT AND TRADEMARK OFFICE
CERTIFICATE OF CORRECTION

PATENT NO. : 7,668,321 B2  Page 1 of 1
APPLICATION NO. : 10/672534
DATED : February 23, 2010
INVENTOR(S) : Greg A. Hupp It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1135 days.

Signed and Sealed this

Twenty-eighth Day of December, 2010

David J. Kappos
*Director of the United States Patent and Trademark Office*